United States Patent [19]

Tharp et al.

[11] 4,335,469
[45] Jun. 15, 1982

[54] METHOD AND SYSTEM FOR RADIATING RF POWER FROM A TRAILING WIRE ANTENNA

[75] Inventors: Nelson B. Tharp, Ellicott City; Harry F. Hartley, Glen Burnie, both of Md.

[73] Assignee: Westinghouse Electric Corp., Pittsburgh, Pa.

[21] Appl. No.: 160,354

[22] Filed: Jun. 18, 1980

[51] Int. Cl.³ .............................................. H01Q 1/30
[52] U.S. Cl. .................................. 455/125; 343/707; 343/703
[58] Field of Search ............... 343/707, 703; 455/121, 455/123, 125

[56] References Cited

U.S. PATENT DOCUMENTS

| | | | |
|---|---|---|---|
| 2,417,191 | 3/1947 | Fox | 343/707 |
| 2,430,173 | 11/1947 | Holmes | 343/707 |
| 2,472,904 | 6/1949 | Kappeler | |
| 2,521,737 | 9/1960 | McKee et al. | |
| 3,428,909 | 2/1969 | Kam et al. | |
| 3,475,703 | 10/1969 | Kennedy | |
| 3,487,412 | 12/1969 | Rogers | 343/707 |
| 3,496,567 | 2/1970 | Held | 343/707 |
| 3,522,609 | 8/1970 | Ellis | 343/707 |
| 3,537,010 | 10/1970 | Roza et al. | 455/123 |
| 3,560,982 | 2/1971 | Fenwick | 343/707 |
| 3,689,928 | 9/1972 | Felsenheld | 343/703 |
| 3,852,669 | 12/1974 | Bowman et al. | 330/207 P |
| 3,909,830 | 9/1975 | Campbell | 343/703 |
| 3,922,679 | 11/1975 | Campbell | 343/703 |
| 4,051,479 | 9/1977 | Altshuler | 343/703 |
| 4,165,493 | 8/1979 | Harrington | 330/207 P |
| 4,201,960 | 5/1980 | Skutta et al. | 455/123 |

Primary Examiner—Howard A. Birmiel
Attorney, Agent, or Firm—H. W. Patterson

[57] ABSTRACT

A trailing wire antenna coupling and control method for providing maximum voltage limited power output from power amplifiers of a high power low frequency RF transmitter system while varying the inductance of the coupling circuit to present a high resistance load having practically zero reactance to the power amplifiers, all during extension and retraction of the antenna toward and from its optimum length, as well as at the optimum length.

7 Claims, 8 Drawing Figures

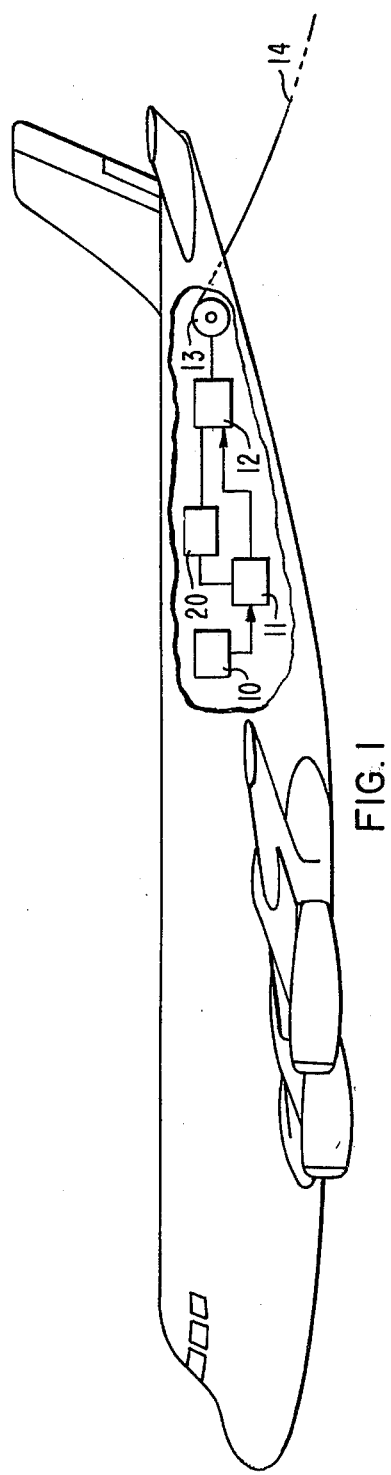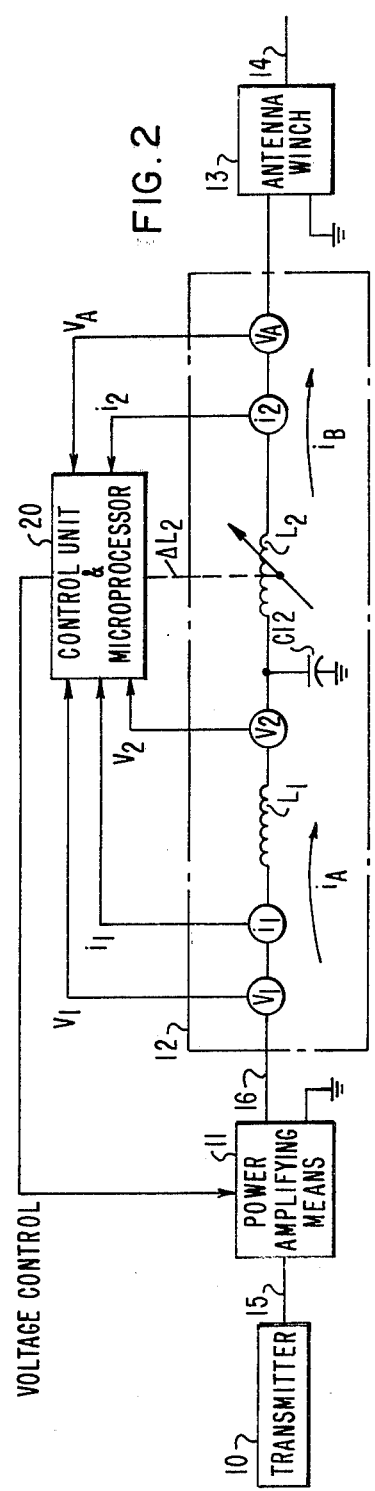

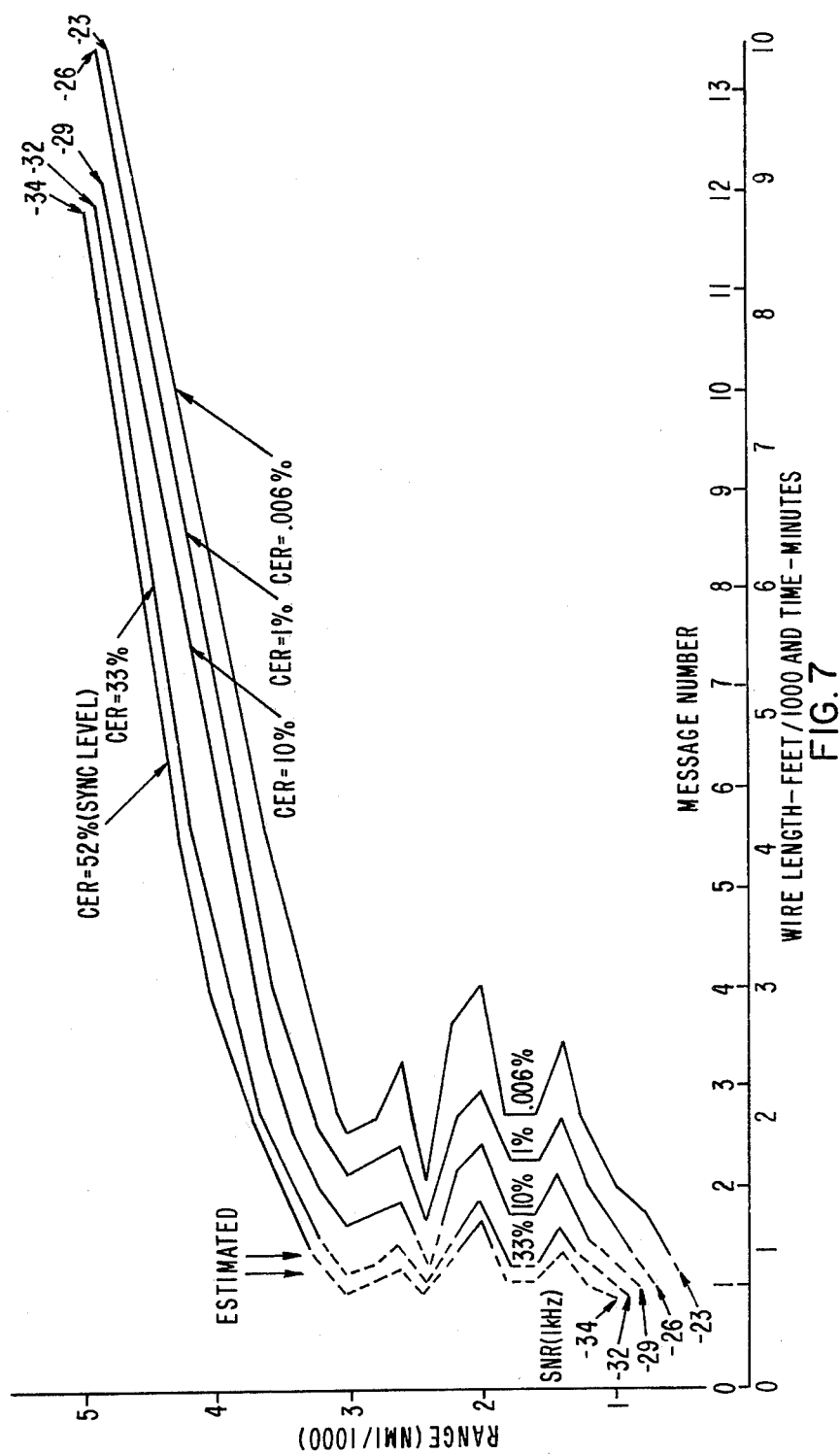

METHOD AND SYSTEM FOR RADIATING RF POWER FROM A TRAILING WIRE ANTENNA

BACKGROUND OF THE INVENTION

1. Field of the Invention

The present invention relates to low frequency radio transmission systems; and more particularly, to a method and system for radiating RF power from a trailing wire antenna.

2. Description of the Prior Art

Low and very low frequencies, such as from 60 to 17 KHz, are presently used for narrow band radio communication over long distances because reliable propagation is available at such frequencies. Since physically large antennas are required to radiate significant power at these frequencies, airborne transmitters utilize a trailing wire antenna that is stored on a reel in the aircraft when the transmitter is not in use, and is unreeled when transmission is required. Such a trailing wire antenna, when fully extended for the LF frequency range may be anywhere from 8,000 to 15,000 feet in length. The antenna wire is energized by applying an RF feed voltage to the wire at the aircraft end; and the impedance seen by the applied RF feed voltage is the high reactance of the aircraft in series with the impedance of the antenna wire that is fed by the RF voltage at the one end. The highest voltage that may be applied between the aircraft and the antenna wire is approximately thirty kilovolts root mean squared (KVRMS) because of corona and/or insulation limitations. The current going into the antenna wire is limited essentially by this high reactance; and thus, the power input to the antenna depends on the input resistance which is relatively low at antenna wire lengths that are considerably less than one-half of the transmitted wavelength ($\lambda/2$). The highest input resistance occurs when the antenna wire is slightly less than $\lambda/2$ in length; and such resistance is typically around 1,000 ohms. This permits somewhat more than 100 kilowatts of RF power to enter the wire as limited by the 30 KVRMS feed voltage.

Prior to the present invention, the fixed power level of the transmitter was applied to the antenna wire without exceeding the allowable antenna voltage at a time when the airborne trailing wire antenna was at its optimum length, which was near $\lambda/2$. Extending the low frequency antenna wire to its optimum length required many minutes because of the long wire length. For example, at the low frequencies mentioned of from 60 to 27 KHz, for example, the extension time varied from approximately 8 to 15 minutes at a normal extension of 1,000 ft./min. Also, in the event that it became impracticable to extend the antenna wire to its full optimum length, or in the event that a portion of such wire became separated from the aircraft, the use of the transmitter became infeasible. Further, particularly in military applications, the delay in the beginning of message transmission may not satisfy mission requirements and also decreases in many instances the survivability of the transmitting aircraft.

In the past, various apparatus and systems have been described for reeling in and out a trailing wire antenna for an airborne radio transmitter together with proposed systems for matching the impedance of the transmission line to the impedance of the transmitter, and for effecting resonance between the transmitter and its trailing wire antenna. For example, U.S. Pat. No. 2,417,191, entitled "Airplane Antenna Automatic Tuning System" appears to propose a system for controlling the effective length of the antenna for effectively radiating energy within the frequency range of the transmitter. This patent describes a tuning element in series between the transmitter and its trailing wire antenna with a differential control circuit that has a connection for adjusting the tuning element of the transmitter to effect resonance between the trailing wire antenna and its transmitter. Also, in U.S. Pat. No. 2,430,173, entitled "Remotely Controlled Antenna Tuning Apparatus" there is described a system for tuning and matching an antenna to its transmitter wherein a terminating dummy impedance is provided that matches the transmission line, and a transformer having a variable inductive coupling for matching the impedance of the antenna to a value substantially equal to the impedance of the dummy impedance. Then the dummy impedance and the transformer are alternately connected to the transmission line, with the antenna length being adjusted in accordance with the input current to the transmission line.

However, as far as is known, the prior art does not disclose an apparatus or system for a very low frequency range high power airborne transmitter having an extendable and retractable trailing wire antenna where the power amplifier means output is varied for maximum power transmission while maintaining the voltage and current at the output of the power amplifier means substantially in phase and within the limitations imposed by the maximum allowable antenna feed voltage for the extended length; while providing means that are responsive to the voltages and currents in the antenna to generate real time control signals for the tuning of the antenna system to provide a stable load impedance for the power amplifier in the face of rapidly varying antenna impedance.

SUMMARY OF THE INVENTION

Broadly, and in accordance with the present invention, a method and system is provided for applying to a trailing wire antenna a substantially maximum allowable feed voltage from the power amplifier means of a transmitter during rapid extension and retraction of the antenna to and from its optimum length; which includes means for controlling in real time the antenna impedance transformation during such change of antenna length.

Further, and in accordance with the present invention, there is provided a system that includes an elongated antenna wire with conventional apparatus for extending and retracting the wire from an aircraft. The feed end of the antenna is coupled to the output of a power amplifier means by a coupler that includes a configuration of inductors and capacitors to transform the highly reactive low antenna impedance to a power amplifier of near zero reactance and high resistivity. A microprocessor receives voltage and current information from the antenna coupler and generates signals to adjust the variable inductance of the antenna such that a high resistance load with small reactance is presented continuously to the power amplifier means of the transmitter as the antenna wire length is changed; and additionally controls the power amplifying means output voltage to provide a maximum antenna feed voltage that does not cause corona or insulation breakdown.

More specifically, and in accordance with the present invention, the trailing wire antenna coupling method and system provides a circuit configuration that comprises first and second mesh impedances with a fixed inductance and variable inductance in series with the antenna and power amplifier means in each mesh. Voltage and current sensors are provided on opposite sides of each inductance, and adjacent the output of the coupling to measure the phase and amplitude of the voltage and current at the output of the amplifier and feed end of the antenna, respectively. A microprocessor operates to compute values including the sum of all the impedances in the first mesh and activates the power amplifier means at approximately 25% of full amplifier voltage. The voltage is sensed on opposite sides of the variable inductance and the current is sensed adjacent to the input of the trailing wire antenna to compute the reactance and inductance on the second mesh. Then the change of such inductance required to resonate the system is computed. The variable inductance is then adjusted in accordance with such change signal and the voltage and current on opposite sides of the fixed inductance as well as the voltage at feed end of the antenna is sampled to compute the phase error at the input of the antenna coupler. This phase error is then compared with the maximum allowable phase error. If it is less, the phase lock loop drives the phase error toward zero. If it is greater, the method is repeated beginning with the first-mentioned sampling step. In response to the sampling of the antenna input voltage, such antenna input voltage is compared with the maximum allowable voltage. If it is less, the output of the power amplifying means is increased; and if such voltage does exceed the maximum allowable, the output of the power amplifying means is decreased. Thus, the antenna radiates approximately maximum voltage limited power while being tuned in real time when the antenna length is not at its optimum radiating length.

BRIEF DESCRIPTION OF THE DRAWINGS

FIG. 1 is a pictorial representation in block diagram of an aircraft carrying an RF transmission and antenna apparatus of the type encompassing the present invention;

FIG. 2 is a schematic block diagram illustrating the overall arrangement of the system and apparatus according to one embodiment of the present invention;

FIG. 7 is a graph to show typical communication ranges of a 100 KW transmitter during antenna wire extension utilizing the method and system of the present invention.

DESCRIPTION OF THE PREFERRED EMBODIMENT

Figure 3:
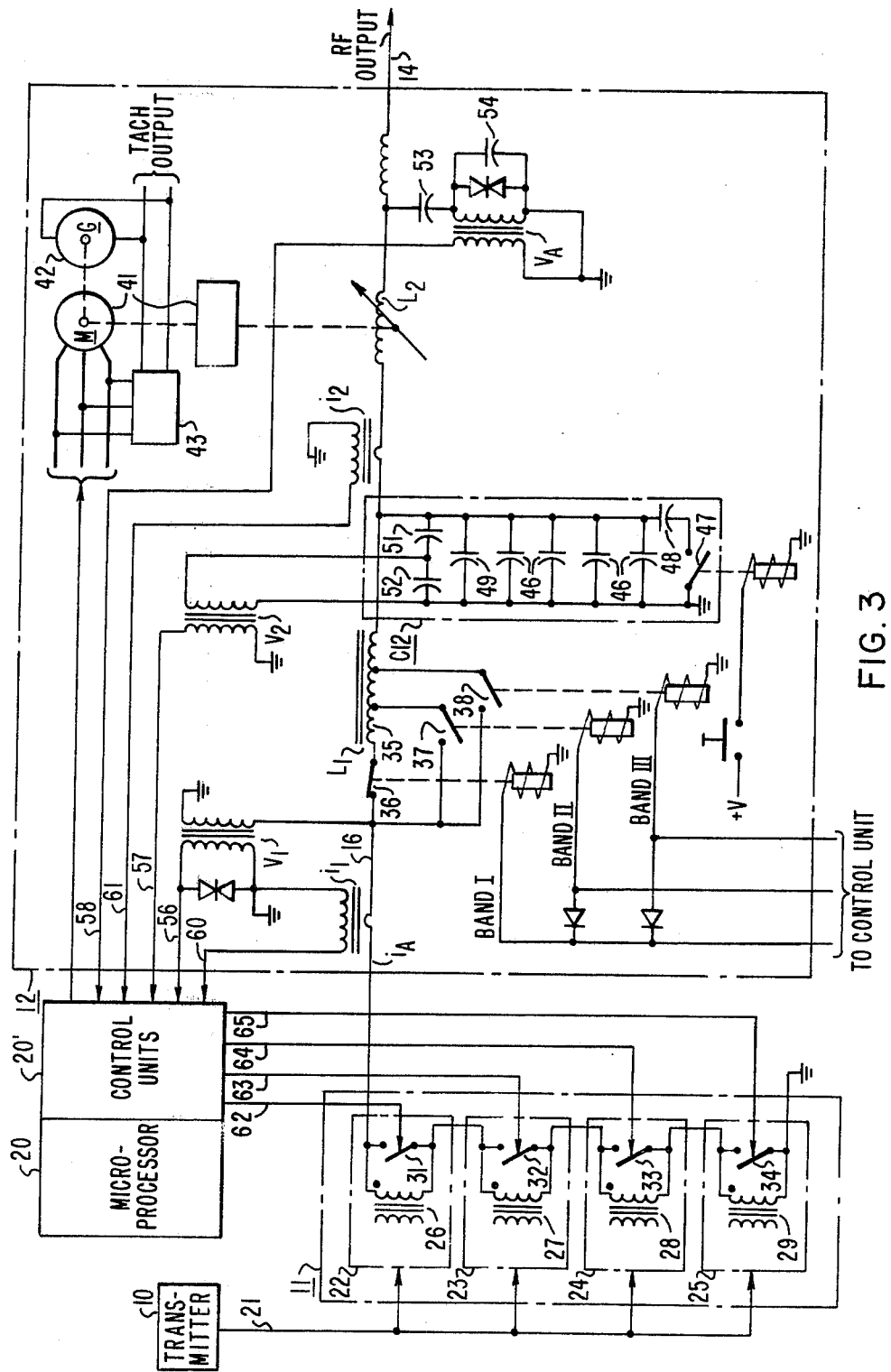
FIG. 3 is a more detailed schematic block diagram of the system in accordance with one embodiment of the present invention.

Referring to FIG. 1, an aircraft is shown in which there is located a long range high power low frequency angle modulated transmitter 10 having power amplifying means 11 and an antenna coupler 12 with a microprocessor and control unit 20 that incorporate the present invention according to one embodiment. A well-known conventional device, such as a reel, referred to at 13, may be utilized to extend or retract an antenna wire 14, which antenna wire is shown trailing behind the aircraft.

Referring to FIG. 2, the transmitter 10 is a low frequency narrow band transmitter that is capable of operating in the neighborhood of 27 to 60 KHz, (which range is defined as a low frequency range) for example, and outputs on line 15 a low level angle modulated carrier frequency to the power amplifier means 11. The power amplifier means 11 is capable of generating at its output 16 up to a nominal 100 KW of power which is deemed to be a high-power transmitter, or a total RF output voltage that is a nominal 3,200 V peak square wave at full power. The power amplifying means 11 is preferably a combination of four 25 KW power amplifier units wherein each of its RF output transformer, which are conventional switching transformers, have secondary windings directly connected in series with each other. The output 16 of the amplifying means 11 is connected to the input of the antenna coupler shown within the dashed lines referred to at 12. An inductance $L_1$ is inserted in feed line 16 to attenuate, in conjunction with capacitor C12, the harmonic currents in the power amplifying means 11. Any such harmonic currents tend to cause drive difficulties and power dissipation in the amplifying means 11. In series with the inductance $L_1$ is variable inductance $L_2$ so that the antenna circuit may be tuned to near resonance such that the impedance to the power amplifying means 11 is essentially a resistive load. As discussed in more detail hereinafter, the inductance $L_2$ is controlled in a manner such that a high resistance load with a small reactance is presented continuously to the transmitter power amplifying means 11. Conventional sensing means $V_1$ and $V_2$ are placed in the antenna line 16 to sense on opposite sides of the inductor $L_1$ the amplitude and phase of the voltage input to the coupler 12. A conventional current sensor $i_1$ is inserted in series with the inductor $L_1$ to sense the amplitude and phase of the input current to the coupler 12. A conventional voltage sensor $V_A$ is inserted in the antenna feed line 16 at the output of the coupler 12 to measure the amplitude and phase of the antenna feed voltage. Similarly, a sensor $I_2$ is inserted in the end feed 16 of the antenna between voltage sensor $V_A$ and the variable inductance $L_2$ to measure the phase and amplitude of the current in the antenna 14. Capacitance referred to as C12 connected between the inductances $L_1$ and $L_2$ in order to attenuate the harmonic power input to the antenna. As the antenna wire is extended by any suitable means such as by the antenna winch 13, the inductance $L_2$ is varied to approximately resonance in the circuit referred to by the solid curved arrow $i_B$. The impedance of mesh $i_B$ is such as to result in a capacitive reactance which is cancelled by the inductor $L_1$ thereby providing a high resistive load for the power amplifying means 11. During extension and retraction of the antenna wire 14, a microprocessor 20 and a control unit referred to at 20 varies the inductance $L_2$ and controls the output voltage of the power amplifying means in response to the sensed voltages and currents of the circuit $i_A$ and $i_B$.

Referring to FIG. 3, which illustrates schematically in greater detail the transmitter antenna system of FIG. 2, the transmitter 10, may be any conventional type RF transmitter that is capable of generating a low frequency, such as between 27 and 60 KHz, for example, and is assumed to include a driver circuit together with appropriate rectifiers and filters that are output over line 21 to inputs of individual power amplifiers referred to as 22, 23, 24, and 25, respectively, of the amplifying means 11. Each of the power amplifiers 22 through 25 are capable of outputting 25 KW, and include output transformers 26, 27, 28, and 29. The output transformers may be of any well known type capable of supporting an input square wave with a peak amplitude approaching in the neighborhood of 260 volts and a peak-to-peak amplitude approaching in the neighborhood of 520 volts. The waveform of the current that flows in each of the transformers 26 through 29 is dependent upon the impedance presented to the transformer by the output circuitry that includes the coupler 12 and the antenna 14. In the proposed system, this RF circuitry presents a resistive load at the fundamental frequency and an inductive impedance at the second and higher harmonics. Thus, the current flowing in the power amplifier output transformers 26 through 29 is mostly a sine wave. Each of the transformers 26 through 29 has an output winding with a respective shorting switch 31 through 34 that is opened to cut in, and closed by the control unit referred to at 20', when it is desired to cut one of the power amplifiers out of the transmitter circuit. The combination of the four 25 KW power amplifier units 22 through 25 provides up to 100 KW output by connecting the RF output transformer secondary windings of the transformers 26 through 29 in series. This forces each of the four amplifiers to deliver the same current. The total RF output voltage of the amplifying means 11 is simply the sum of the four secondary voltages, which is preferably a nominal maximum of 3,200 volts peak square wave. The output current $i_A$ is a sine wave with some odd harmonic content which is filtered the required amount.

In the antenna coupler 12, the inductance $L_1$, which is provided to attenuate the harmonic currents in the power amplifier as previously mentioned, includes a winding 35 that is appropriately tapped to provide three different levels of inductance for difference frequency bands. These levels are selected by appropriately opening and closing contacts 36, 37, and 38 of relays referred to as band I, II, and III which are controlled by the control unit 20' when the frequency of the transmitter is selected. For example, if the frequency band is between 27 and approximately 35 KHz, for example, then frequency band I is selected, and contact 36 is closed while contacts 37 and 38 are opened. Frequency band II is selected for frequencies between 35 and 46 KHz, for example, whereby contact 37 is closed while contact 36 and 38 remain open. Band III may be used to operate between 46 and 60 KHz wherein contact 38 is closed while contacts 36 and 37 remain open. The inductance $L_2$ is variably controlled by a conventional tuning slug motor 41 controlled by a small tachometer generator 42 through a conventional control mechanism 43 to vary the inductance for tuning the antenna coupler circuit to near resonance such that the impedance is a resistive load for the power amplifier. The motor 41 is controlled by the control unit which in turn is governed by the microprocessor 20 in a manner described in more detail hereinafter. The inductance $L_1$ is a tapped, ferrite loaded coil, and the variable inductance $L_2$, has a similar type coil. The bank of capacitors within the dashed line C12 is comprised of a plurality of parallel connected capacitors connected to ground in order to bypass any harmonic currents to prevent radiation from the antenna 14. Parallel capacitors generally referred to at 46 may be selectively cut in and out of the antenna circuit by way of switch 47. Capacitor 48 may have a value of 4700 picofarads, while the capacitors 46 may each have a value of 5,100 picofarads. The capacitor 49 may have a value of 4,700 picofarads while the two series connected capacitors 51 and 52 have a value of 2,700 picofarads and 1.0 microfarads, respectively. Conventional current sensing transformers $i_1$ and $i_2$ are used to sense the current flowing in inductance $L_1$ and the antenna respectively; the voltage sensing transformer $V_1$ picks the voltage from the inductive taps of the inductor $L_1$ and transforms the voltage to provide proper level to control unit 20'. The transformer $V_2$ picks the voltage off the capacitor divider 51 and 52 and provides transportation for control unit 20'. The transformer $V_A$ picks the voltage off the capacitor divider 53, 54 and also provides proper transformation to the control unit 20'. Thus the voltage sensing transformers $V_1$ and $V_2$ which may be conventional ferrite core transformers sense the voltage on opposite sides of the inductance $L_1$ in the antenna coupler circuit. The voltage sensor $V_A$ which is similar to $V_1$ and $V_2$, senses the voltage at the output of the coupler, through a capacity divider, to determine the actual voltage going into the antenna 14. The voltage and current sensors, are input to respective lines of the control unit generally referred to at 20. The voltage sensor $V_1$ and $V_2$ are input over lines 56 and 57, respectively. Sensed voltage $V_A$ is input over a line 58 while the sensed current from $i_A$ and $i_B$ is input to the control unit 20' over lines 60 and 61, respectively. The details of the control units form no part of the present invention and may be of any well-known type that transforms a sensed voltage and current into a value for utilization in the microprocessor 20. The control units 20' also provide outputs over lines 62, 63, 64, and 65 for governing the power output of the transmitter.

The microprocessor portion 20 of the control 20 includes a conventional central processing unit and its associated memory functions which include both random access memory and read only memory and may constitute the well-known microprocessor manufactured by Texas Instruments bearing Model No. SBP9900M, for example, which includes a 64 pin LSI package that implements an instruction set. Such a microprocessor preferably includes multiply and divide and address capability up to over 65,000 bytes of memory and up to 16 prioritized hardware interrupts. It is also well known that such a microprocessor may include two types of memory chips along with the central processing unit chip which includes 12k bytes of read only memory for storage of the operating program and constant data, and 4k bytes of random access memory for storage of the operating variables.

Figure 4:
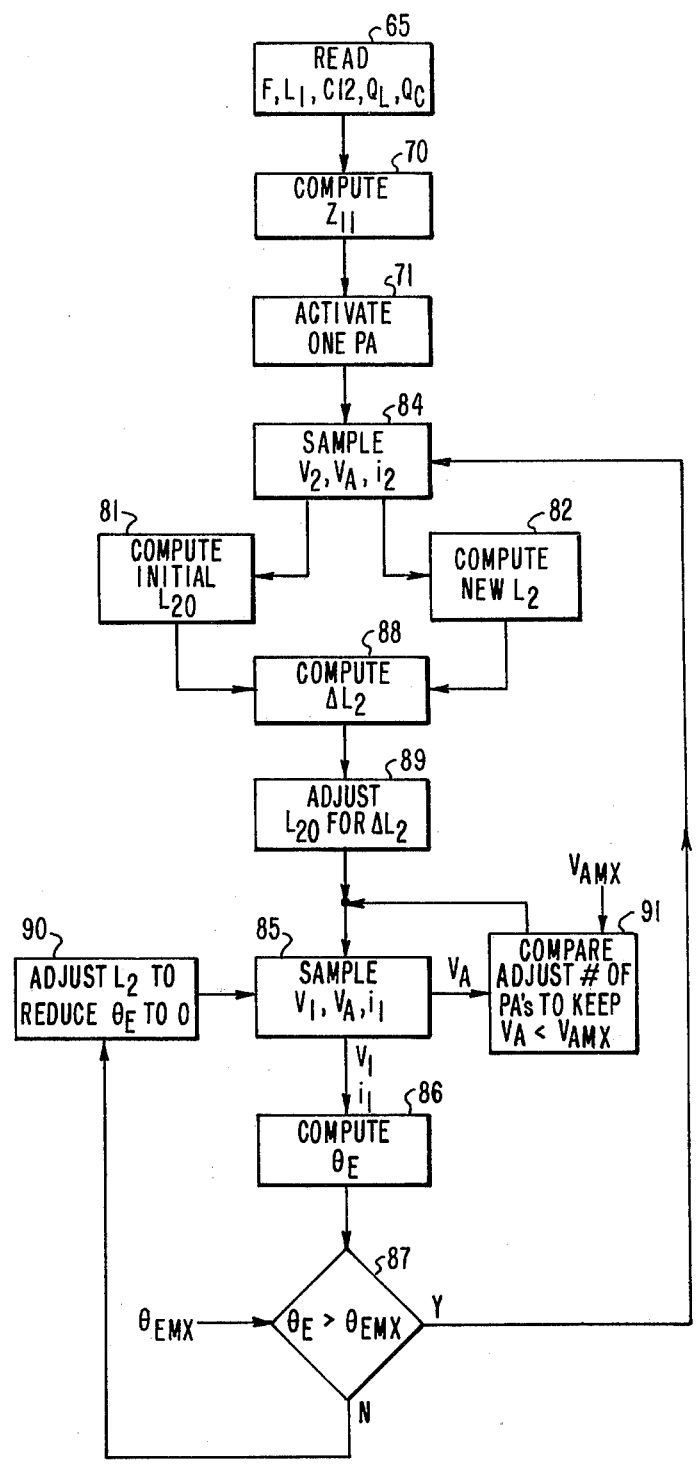
FIG. 4 is a functional flow diagram to illustrate the manner in which the sensed values are utilized and processed to operate the system of FIG. 3.

In describing the operation of this system and the method in which the variable inductance $L_2$ is adjusted to provide a high resistance load with small reactance that is presented continuously to the transmitter power amplifiers 22 through 25 connected to the antenna coupler; and the control of the output of the power amplifiers 22 through 25 as the antenna wire is extended or retracted to produce an antenna feed voltage insufficient to cause corona or insulation breakdown at the antenna feed point 14 (see FIG. 3), reference is first made to the general flowchart of FIG. 4. In operation, the system is activated to provide a transmitter output at a selected frequency and the system is initialized such that all of the switches 31 through 34 at the output of the individual power amplifiers 22 through 25 are closed. The switch 47 is either opened or closed depending upon the frequency selected for the transmission which includes or excludes the capacitor 48 from the circuit. Also, depending upon the frequency band selected, the various taps on the inductor $L_1$ are bypassed as previously described.

Referring to FIG. 4, the frequency F, inductance $L_1$, the capacitance C12, and the quality factors thereof $Q_L$ and $Q_C$ are read at block 65, and the impedance $Z_{11}$ of mesh $i_A$ is computed at block 70, which is followed by the actuation of one of the power amplifiers, such as 22, shown by block 71. The voltages $V_2$, $V_A$, and current width $i_B$ are sampled at block 84 and the initial reactance X of $L_2$ and the initial inductance of $L_2$ is computed at block 81. The new $L_2$ required for system resonance is computed at block 82. Any change in such inductance is then determined at block 88, and the control unit 20 adjusts the variable inductor $L_2$ as shown by block 89. The voltage and current at $V_1$ and $i_A$ are sampled at block 85 to compute the phase error $\theta_E$ of the voltage vs. current between the transmitter and antenna coupler at block 86. Also, the voltage $V_A$ is sampled at block 85. The value of $\theta_E$ is then compared to determine if it is greater than the maximum phase error allowable at block 87, and the voltage $V_A$ is compared with the maximum allowable at block 91 to determine if the voltage in the antenna is more or less than the maximum allowable. Also, in block 91, the number of power amplifiers switched in is controlled such that $V_A$ remains below $V_A$ maximum. The variable inductor $L_2$ is adjusted to reduce the phase error $\theta_E$, to zero at block 90.

Figure 5A:
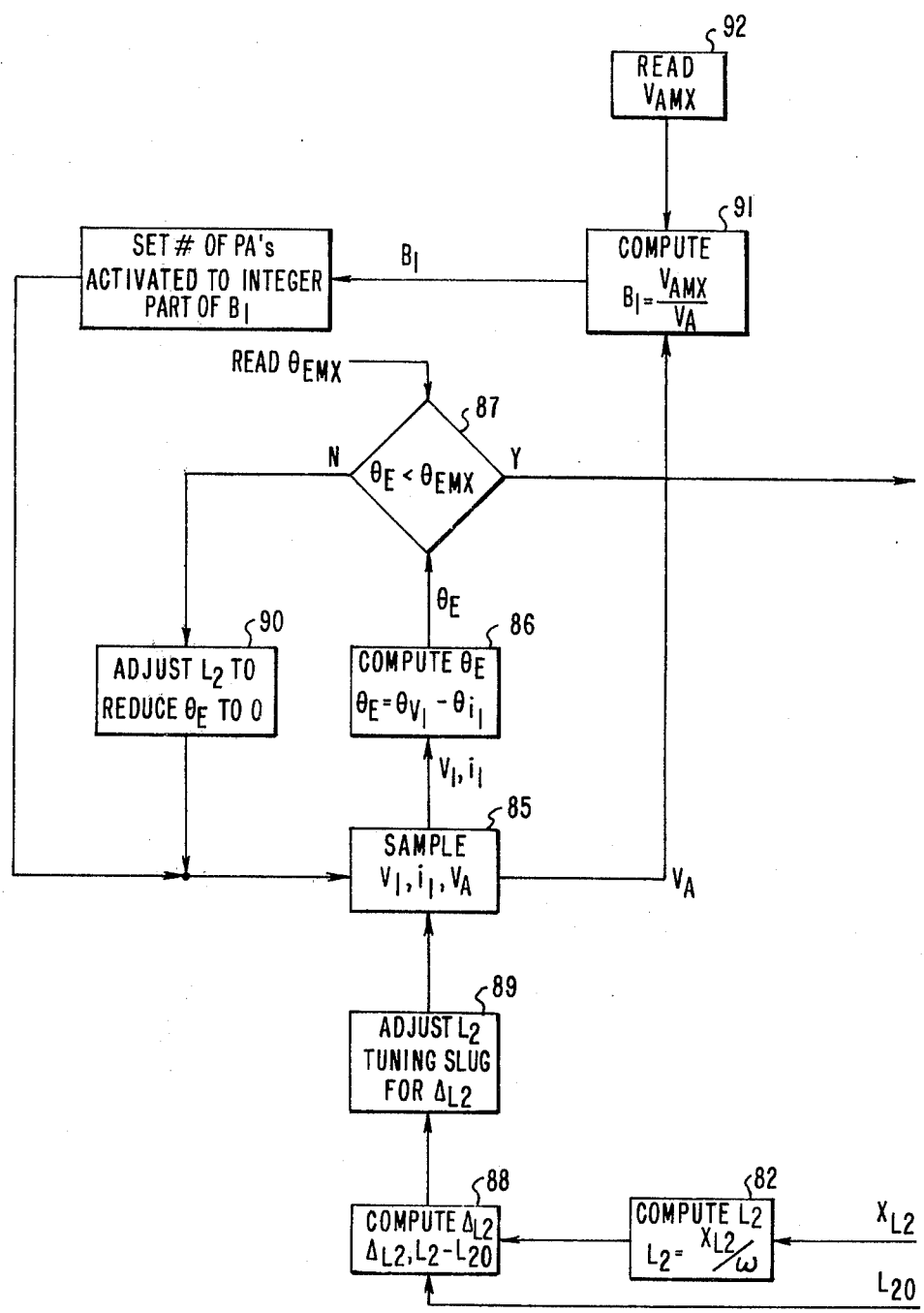
FIGS. 5A and 5B is a more detailed flow diagram of FIG. 4 illustrating the method in accordance with the present invention.
Figure 5B:
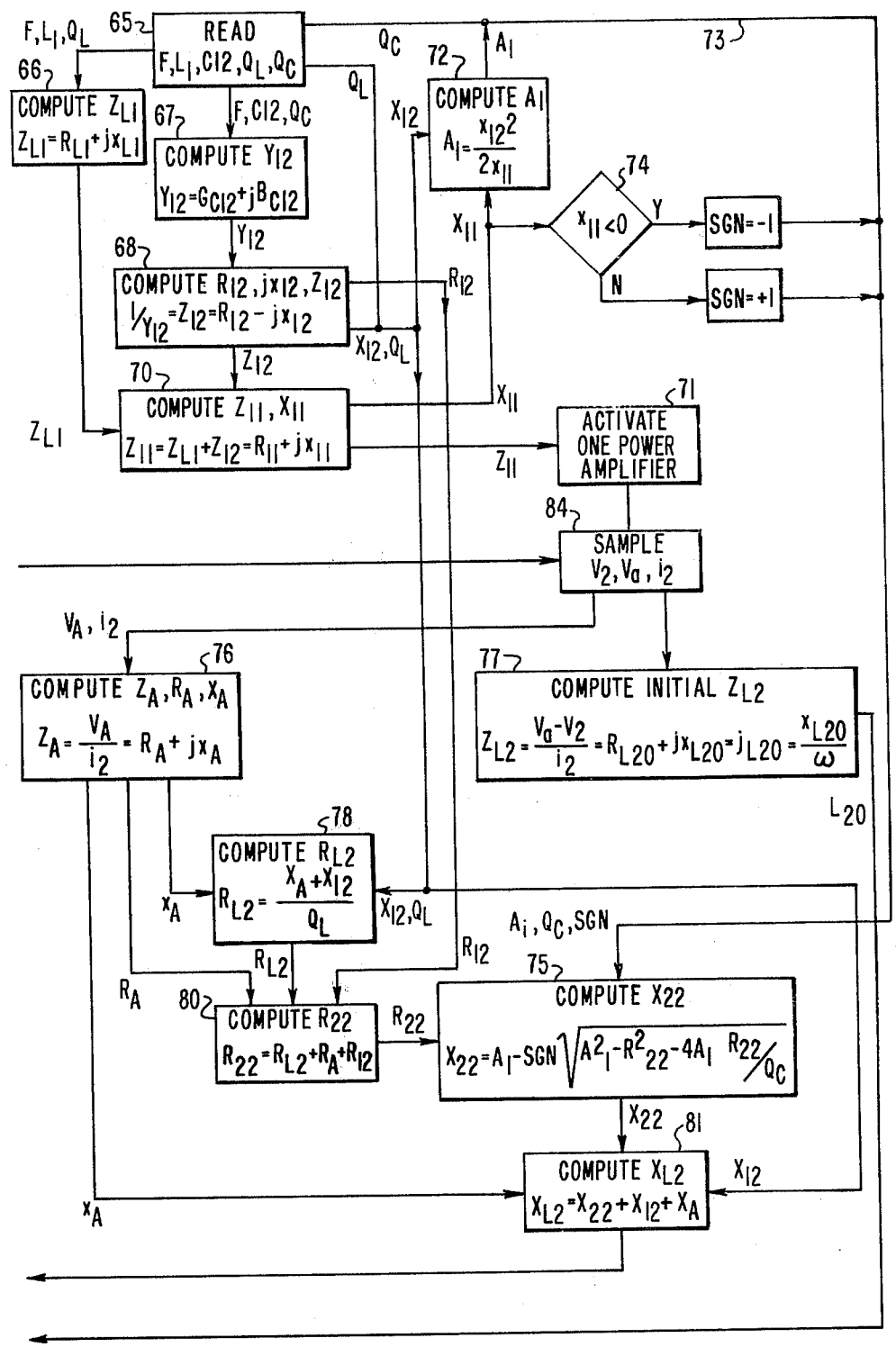

Referring to the more detailed flow chart of FIGS. 5A and 5B, the frequency selected by the transmitter together with the inductance $L_1$, the capacitance C12, and the quality factor of the inductors $L_1$ and C12, referred as $Q_L$ and $Q_C$, respectively, are read and stored in the memory of the microprocessor as indicated by block 65 as previously mentioned. Such values are then read and output over appropriately designated lines of FIGS. 5A and 5B to compute the impedance of the inductor $L_1$ at block 66; and to compute the admittance that is common to both the meshes $i_A$ and $i_B$ ($Y_{12}$) at block 67. At block 68 the impedance $Z_{12}$ common to current meshes $i_A$ and $i_B$ is computed. Such values are referred to as $R_{12}$, $jx_{12}$, and $Z_{12}$ of block 68, respectively. The impedance $Z_{12}$ from block 68 and the impedance $Z_{L1}$ from block 66 is used to compute the impedance $Z_{11}$ in the mesh $i_A$. This computation is accomplished at block 70; and once it has been accomplished, an appropriate output is provided to activate one of the amplifiers 22 through 25 by the opening of one of the switches 31, for example, which operation is described in block 71. The reactance in the mesh $i_A$ referred to as $x_{11}$, is output to block 72 to compute a value $A_1$ which value is $x_{12}^2/2x_{11}$ in order to be used in the determination of the reactance of the second mesh $i_B$ (FIG. 2). The value $Q_C$ is output over line 73 together with the output $A_1$ from block 72; and the reactance $x_{11}$ is input to a decision block 74. In the event the reactance in the first mesh $i_A$ is less than zero, a sign, SGN, is set at $-1$; and if such value is not less than 0 then the sign, SGN, is set at $+1$. These three values are then input to block 75 to perform a computation as hereinafter described.

Once the power amplifier such as 22, for example, has been activated, the voltages $V_2$, $V_A$, and the current $i_B$ are sampled by the sensors previously described. These samples are used to compute at box 76 $Z_A$, the resistance $R_A$ and the reactance $x_A$ of the antenna. Such values are also used to compute the initial impedance $Z_{L2}$ of the inductor $L_2$ and the initial inductance $L_{20}$ of $L_2$ at box 77. The reactance $x_{12}$ from block 68, $Q_L$ from block 65, and the reactance $x_A$ from box 76 are used to compute at block 78 the resistance $R_{L2}$ which is the resistance of the inductor $L_2$. The value $R_{L2}$ together with the value $R_A$ from block 76 and the value $R_{12}$ from block 68 is used to compute, in block 80, the resistance $R_{22}$ in the second mesh referred to as $i_B$ of FIG. 2. The value $R_{22}$ is then used, along with the values $A_1$, $Q_C$, and SGN on the line 73, at block 75 to compute $X_{22}$, the reactance in the second mesh. $X_{22}$ from the block 75 together with the reactance $x_{12}$ that is common to both of the meshes, and the reactance of the antenna $x_A$ is then used to compute at block 81 the reactance $x_{L2}$ that $L_2$ has to supply in mesh $i_A$ to resonate the system. The reactance $x_{L2}$ from block 81 is then used to compute the inductance $L_2$ which is in the inductor $L_2$ by dividing the reactance $x_{L2}$ by $\omega$ ($=2\pi F$) that is stored in the microprocessor. The value $L_2$ from block 82 is then compared with the initial value $L_{20}$ from the box 77 to determine the change of inductance in the circuit in accordance with the sampled values at block 84. The variable inductance is adjusted by operating the tuning slug 41 of FIG. 3.

The adjustment of the tuning slug for the inductance $L_2$ triggers a control for sampling the voltage from sensors $V_1$, and $V_A$ and the current from the sensor $i_1$ as noted at block 85. The voltage and current from the sensors $V_1$ and $i_1$ are used to compute the phase error $\theta_E$ at the input to the coupler 12 at block 86. The phase error is then fed to a decision block 87 and compared with the maximum value $\theta_{EMX}$ of the input current phase error above which the phase lock loop comprised of blocks 85, 86, 87, and 90 will lose lock. If such phase error is greater than the value $\theta_{EMX}$ then the voltage and currents at block 84 are again sampled to ultimately compute $\Delta L_2$ at the block 88 to adjust the tuning slug for $L_2$ to reacquire phase lock. If the phase error is not as great, the decision block 87 directs the adjustment of $L_2$ to reduce such phase error to zero as noted at block 90. The sample voltage $V_A$ from block 85 is then used at block 91 to compute a fraction $B_1$ of the maximum antenna voltage $V_{AMX}$, present at the feed end of the antenna. $V_{AMX}$ is read in from block 92. The number of power amplifiers to be used is set equal to the integer part of the fraction $B_1$. This procedure will maintain $V_A$ at a level equal to or less than the maximum allowable antenna voltage $V_{AMX}$. If the actual antenna voltage is greater than the maximum antenna voltage, then one or more of the power amplifiers are subtracted or cut out. The foregoing comparisons and calculations are constantly read and computed several times per second during the extension or retraction of the antenna 14, thus insuring maximum power output consistent with maximum allowable antenna feed voltage.

The following table shows computed operating data for transmitting during wire extension at 27 KHz. The voltage, current, and power levels are those which would result if a constant antenna feed voltage of 25 kV rms were maintained. The column headed $V_G$ shows the transmitter voltage required to do this. Actual transmitter voltage will be available in increments of 707 volts per module. The table suggests the use of two modules up to about 10,000 feet of wire, and then the use of three modules until the normal mode is reached. Third harmonic power is less than 60 dB below fundamental power at the short lengths where the radiated power is small, but approaches 60 dB as the wire approaches normal operating length. The third harmonic antenna impedance exhibits half-wave and full-wave resonance effects of the wire at 5 to 6,000 ft. and 11 to 12,000 ft. The series capacity of the aircraft prevents the passage through zero of the input reactance. The third harmonic power attenuation goes through minima at the above resonances.

| Wire Length (kFt) | $Z_A$ Antenna Fundamental Impedance ($\Omega$) | Antenna 3rd Harmonic Impedance ($\Omega$) | Tuning Inductance $L_2$ (mH) | VG (kV) | Coupler Input Z ($\Omega$) | Coupler Input Power (watts) | Antenna Input Power (watts) | Radiated Power (watts) | 3rd Harmonic Power Attenuation (dB) | kVA of $L_2$ | Antenna Input Current, $I_Z$ (Arms) |
|---|---|---|---|---|---|---|---|---|---|---|---|
| 1  | 0.13 − j2853 | 0.30 − j942 | 17.9 | 1.65 | 4530 + j0 | 601   | 9.76  | 0.86 | 47.4 | 233 | 8.76 |
| 3  | 0.71 − j2590 | 4.5 − j804  | 16.4 | 1.82 | 4580 + j0 | 722   | 65.8  | 14.9 | 42.5 | 259 | 9.65 |
| 5  | 1.67 − j2505 | 164 − j464  | 15.9 | 1.88 | 4170 + j0 | 846   | 166   | 54.9 | 30.7 | 268 | 9.98 |
| 7  | 3.27 − j2453 | 24.2 − j943 | 15.6 | 1.92 | 3560 + j0 | 1030  | 339   | 140  | 41.1 | 274 | 10.2 |
| 9  | 6.12 − j2409 | 12.4 − j809 | 15.3 | 1.95 | 2790 + j0 | 1370  | 660   | 315  | 46.8 | 280 | 10.4 |
| 11 | 12.0 − j2359 | 161 − j536  | 15.0 | 1.99 | 1910 + j0 | 2080  | 1350  | 719  | 38.7 | 286 | 10.6 |
| 13 | 27.8 − j2288 | 36.2 − j949 | 14.6 | 2.05 | 1030 + j0 | 4070  | 3320  | 1920 | 48.1 | 295 | 10.9 |
| 15 | 98.9 − j2139 | 17.3 − j814 | 13.5 | 2.07 | 300 + j0  | 14300 | 13500 | 8250 | 56.7 | 312 | 11.7 |

Figure 6:
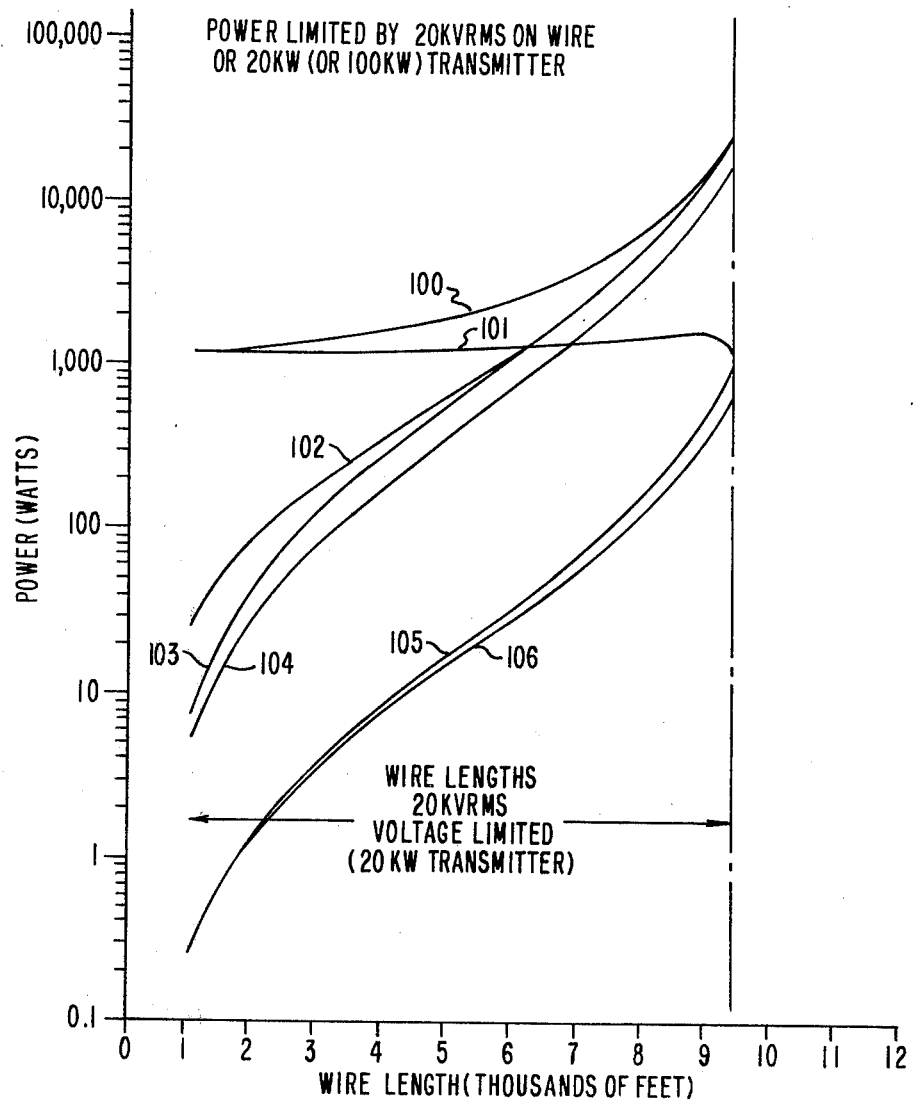
FIG. 6 is a graph illustrating optimum power in watts as a function of the length of the trailing wire antenna.

Referring to FIG. 6, which shows calculations for energized extension at 44 KHz operating frequency, the radiated power was limited by 20-kV rms antenna feed voltage. The VERP (vertical effective radiated power) for the TM propagation mode and HERP (horizontal effective radiated power) for the TE propagation mode as launched from the trailing wire are shown for both broadside and end aspects. Broadside HERP is greater than total radiated power because of antenna directive gain.

In FIG. 6, line 100 illustrates the power $P_T$ of the transmitter; line 101 represents the power loss of the tuner $P_C$; and line 102 represents the power going into the antenna wire referred to as $P_W$. The horizontal effective radiated power broadside (HERP) is represented by line 103; and the total radiated power $P_R$ is represented by the line 104. Line 105 represents the vertical effective radiated power (VERP) in the broadside aspect, while line 106 represents VERP in the end aspect.

The significance of adding the capability to transmit while extending the wire is illustrated in FIG. 7. Here, air-to-air communication range with 50 baud FSK (m = ½) where m = the modulation index is shown as a function of transmitting wire length. Radiated power is limited by either a 40-kV peak antenna feed voltage, or the 100 KW of power available, whichever gives the lower feed voltage.

Thus, in summary there has been disclosed a system and method where the distribution of voltage and current sensors in the network provides amplitude and phase information on all voltages and currents to the microprocessor. In the microprocessor portion of the system, the particular input voltage and current data is utilized in a specific manner to compute the control signals for tuning the antenna and providing the power amplifier voltage output. The real time control of the tuning of the antenna network by the microprocessor provides a stable load impedance for the power amplifiers in the face of a rapidly varying antenna impedance. Such distribution of the voltage and current sensors, and the procedures for using such values, together with the real time control, provides for the automatic adjustment of the variable inductance $L_2$. This occurs in such a way that a high-resistance load with small reactance, is presented continuously to the transmitter power amplifier as the antenna wire is extended or retracted; while the power amplifier output voltage is controlled to produce an antenna feed voltage $V_A$, which is no greater than that which would cause corona or insulation breakdown at the antenna feed point. Although, a specific embodiment has been shown and described to an extent that will enable a person skilled in the art to practice the invention, it is understood that variations and modifications may be made without departing from the spirit or scope of the present invention as defined by the appended claims.

What is claimed is:

1. A method of applying the output of a transmitter power amplifier means to a trailing wire antenna of an airborne RF transmitter system to effect optimum message transmission during extension and retraction toward and from the optimum length of the antenna, comprising
    varying the inductance of the antenna coupler in response to the antenna change of length to provide a high-resistance load having minimal reactance to the power amplifier means, and
    varying the value of the power output of the power amplifier means as a function of the voltage amplitude sensed at the feed end of the antenna and the voltage and current sensed at opposite sides of the coupler.

2. A method according to claim 1 wherein the power amplifier means constitutes a plurality of individual power amplifier capable of being selectively connected and disconnected from the antenna, wherein the step of varying the value, comprises
    determining an integer ratio of the sensed value of the voltage amplitude to the maximum allowable amplitude, and
    selectively connecting and disconnecting the power amplifiers in accordance with said integer ratio.

3. A method according to claim 1 wherein the step of varying the inductance, comprises
    sampling the phase and amplitude of a first voltage and current on opposite sides of a variable inductor,
    sampling the phase and amplitude of the voltage at the feed end of the antenna,
    determining the actual inductance and the desired inductance as a function of the sampled values,
    determining the desired change of inductance, and
    varying the inductance as determined by the desired change.

4. A method according to claim 3 wherein the step of varying the inductance, further comprises sampling the phase of a voltage and current on the input of a second inductance connected in series between the power amplifiers on said first-mentioned inductance, determining the error in phase between the voltage and current into the second inductance, and varying the first-mentioned inductance to reduce the determined phase error.

5. An airborne RF communication system having a transmitter and trailing wire antenna capable of being extended to and retracted from an optimum length, said system comprising a power amplifier means connected to the transmitter operable to output selected voltage increments from a predetermined minimum to maximum, a coupling circuit connecting the output of the amplifier means to the antenna, said coupling circuit including a first and second inductance in series with the output of the amplifier means and the antenna wire, a capacitance connected between the first and second inductance and ground segregating the coupling circuit into a first and second impedance mesh, a first voltage sensor positioned to sense the voltage to ground between the amplifier means output and the first inductance, a second voltage sensor positioned to sense the voltage to ground between the first and second inductances, a third voltage sensor positioned to sense the voltage to ground between the second inductance and antenna wire at its feed end;

a first current sensor positioned to sense the current between the amplifier means output on the first inductance, a second current sensor means positioned to sense the current between the second inductance and the feed end of the antenna wire, means to detect values corresponding to the transmitter output frequency, the first inductance, the capacitance, and the quality factors of the inductance and capacitance;

first sampling means to sample the voltage of the second and third voltage sensors and the second current sensor;

first determining means governed by the detected values and sampled values of the first sampling means to determine the reactance of the antenna and the sum of the reactances of the second mesh impedance, second detecting means to determine the reactance of the second inductance in accordance with the determined values of the first determining means, third determining means governed by the values sampled by the first sampling means to determine the value of the second inductance, fourth determining means governed by the reactance of inductance determined by the second means and the value of second inductance determined by the third means to determine the desired change in second inductance, means to vary the second inductance in accordance with the desired change.

6. A system according to claim 5 wherein the system further comprises a second sampling means to sample the first sensed voltage, the third sensed voltage and the first sensed current, means to determine the phase error between the sampled voltage and current by the second sampling means, means to selectively increase or decrease the incremental output of the power amplifier means in accordance with the third inductance sampled by second sampling means; and means responsive to determined phase error to vary second inductance.

7. A coupling circuit and control system for a trailing wire antenna of an RF transmitter for providing maximum voltage limited power output while the antenna is not at its optimum length, comprising a power amplifier means connected to the output of the transmitter, a coupling circuit having a first and second inductance in series with the amplifier means output and the trailing wire antenna at its feed end, a capacitance means electrically connected to the circuit between the first and second inductances and ground to provide first and second impedance meshes, first voltage and current sensors to sense amplitude and phase of the voltage and current between the power amplifier means output and the first inductance, second voltage and current sensors to sense amplitude and phase of the voltage and current between the second inductance and the antenna at its feed end, a third voltage sensor to sense the amplitude and phase of the voltage to ground between the first and second inductances, means responsive to signals from the second voltage and current sensors and the third voltage sensor to first vary the second inductance of the circuit to correspond to a predetermined value, means responsive to signals from the first voltage and current sensors to further vary the second inductance to reduce phase error toward zero, and means responsive to a signal from the third voltage sensor subsequent the first variation of the second inductance to selectively increase or decrease the power amplifier output.

* * * * *